(12) United States Patent
Harvey Terhune, IV

(10) Patent No.: US 11,373,926 B2
(45) Date of Patent: Jun. 28, 2022

(54) RESTRICTING POLE EQUIPPED WITH CAPTIVE RING TO COMMONLY RESTRAIN TORSIONED WIRE LOCATED AT CORNER OF STIFFENER

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Albert Harvey Terhune, IV, Chandler, AZ (US)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 73 days.

(21) Appl. No.: 16/846,853

(22) Filed: Apr. 13, 2020

(65) Prior Publication Data
US 2020/0328135 A1   Oct. 15, 2020

Related U.S. Application Data

(60) Provisional application No. 62/833,627, filed on Apr. 12, 2019.

(51) Int. Cl.
*H01L 23/40* (2006.01)

(52) U.S. Cl.
CPC .... *H01L 23/4006* (2013.01); *H01L 2023/405* (2013.01); *H01L 2023/4081* (2013.01); *H01L 2023/4087* (2013.01)

(58) Field of Classification Search
CPC ........... H01L 23/4006; H01L 2023/405; H01L 2023/4081; H01L 2023/4087;
(Continued)

(56) References Cited

U.S. PATENT DOCUMENTS

2010/0130030 A1* 5/2010 Liao ..................... H05K 7/1053
439/68
2011/0157833 A1* 6/2011 Bohannon ........... H01L 23/4006
361/709

(Continued)

*Primary Examiner* — Bitew A Dinke
(74) *Attorney, Agent, or Firm* — Ming Chieh Chang; Wei Te Chung

(57) ABSTRACT

The load force bolster assembly includes a metallic stiffener. A carrier associated with a CPU (Central Processing Unit) is located upon the load force bolster assembly and positioned upon the electrical connector. A heat sink is located upon both the carrier and the load force bolster assembly wherein a torsioned wire of the bolster assembly provides a downward force upon an up-and-down movable stud which is secured to a screw of the heat sink so as to downwardly push the heat sink, thus enhancing the normal forces among the heat sink, the CPU and the contacts of the electrical connector. To efficiently hold the torsioned wire in position around a bottom corner of the stiffener, a retention groove is formed around the top portion of the restricting pole, and a pressing ring is downwardly snapped into the retention groove so as to restrain the torsioned wire in position.

14 Claims, 9 Drawing Sheets

(58) Field of Classification Search
CPC ............ H01L 23/4093; H01R 12/7052; H01R 12/716; H05K 1/0209; H05K 2201/066; H05K 2201/10189
See application file for complete search history.

(56) References Cited

U.S. PATENT DOCUMENTS

| | | | |
|---|---|---|---|
| 2013/0078827 A1* | 3/2013 | Yeh .................... | H01R 12/88 439/76.1 |
| 2018/0175538 A1* | 6/2018 | Wu .................... | H01R 12/716 |
| 2018/0190561 A1* | 7/2018 | Wu .................... | H05K 7/10 |
| 2019/0088572 A1* | 3/2019 | Wu .................... | H01L 23/4006 |
| 2019/0115282 A1* | 4/2019 | Wu .................... | H01L 23/4006 |
| 2019/0302857 A1* | 10/2019 | Buddrius ............ | H05K 7/183 |
| 2019/0304871 A1* | 10/2019 | Laido ................ | H01L 23/4093 |
| 2019/0306985 A1* | 10/2019 | Ferguson ........... | H01R 12/88 |
| 2019/0393631 A1* | 12/2019 | Haswarey .......... | H01R 12/7023 |
| 2020/0058572 A1* | 2/2020 | Wu .................... | H05K 7/2049 |
| 2020/0101570 A1* | 4/2020 | Potter ................ | H01L 23/4093 |

* cited by examiner

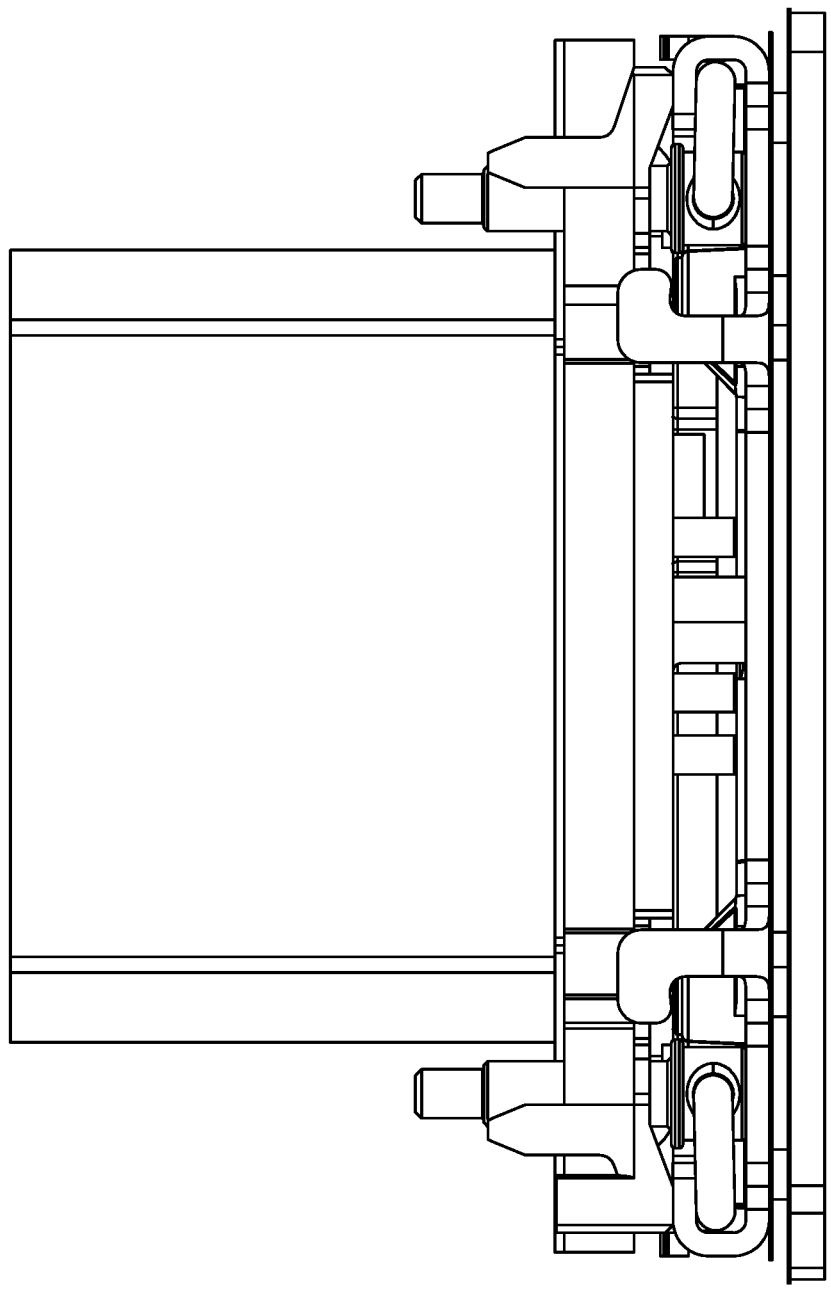

RESTRICTING POLE EQUIPPED WITH CAPTIVE RING TO COMMONLY RESTRAIN TORSIONED WIRE LOCATED AT CORNER OF STIFFENER

BACKGROUND OF THE INVENTION

1. Field of the Invention

The present invention relates generally to a bolster assembly, and more particularly to the bolster assembly for use among an electronic package, the electrical connector and a heat sink.

2. Description of Related Arts

U.S. Patent Application Publication No. 2019/0088572 discloses the spring plate bolster structure surrounding the electrical connector for the heat sink fastening. Another bolster structure is to use a torsion spring wire cooperating with an up-and-down moveable stud in place of the spring plate bolster structure. Notably the round wire is easy to be moveable so a restricting pole cooperating with a fastening shim screwed at the top thereof is used to retain such a torsioned wire in position. Anyhow, the fastening shim easily rotates, disregarding whether it abuts against the corresponding side wall, so as not to efficiently hold the torsioned wire in position. In addition, screwing the fastening shim upon the top of the restricting pole intimately beside the corresponding side wall, is essentially not fit for the automation assembling.

An improved mechanism upon the restricting pole for easy assembling and efficient retention thereto is desired.

SUMMARY OF THE INVENTION

An object of the invention is to provide an electrical assembly with a load force bolster assembly cooperating with a back plate assembly to sandwich therebetween a printed circuit board on which an electrical connector is mounted and surrounded by the load force bolster assembly. The load force bolster assembly includes a metallic stiffener. A carrier associated with a CPU (Central Processing Unit) is located upon the load force bolster assembly and positioned upon the electrical connector. A heat sink is located upon both the carrier and the load force bolster assembly wherein a torsioned wire of the bolster assembly provides a downward force upon an up-and-down movable stud which is secured to a screw of the heat sink so as to downwardly push the heat sink, thus enhancing the normal forces among the heat sink, the CPU and the contacts of the electrical connector. To efficiently hold the torsioned wire in position around a bottom corner of the stiffener, a retention groove is formed around the top portion of the restricting pole, and a press ring is downwardly snapped into the retention groove so as to restrain the torsioned wire to be snugly received within a space defined among the corresponding side wall and bottom wall of the stiffener, the restricting pole and the pressing ring without improper movement due to torsion operation derived from raising-up of the stud.

BRIEF DESCRIPTION OF THE DRAWING

FIG. 5(A) is a side view of the electrical assembly of FIG. 1(A) when the stud is not raised up.

DETAILED DESCRIPTION OF THE PREFERRED EMBODIMENT

Figure 1A:
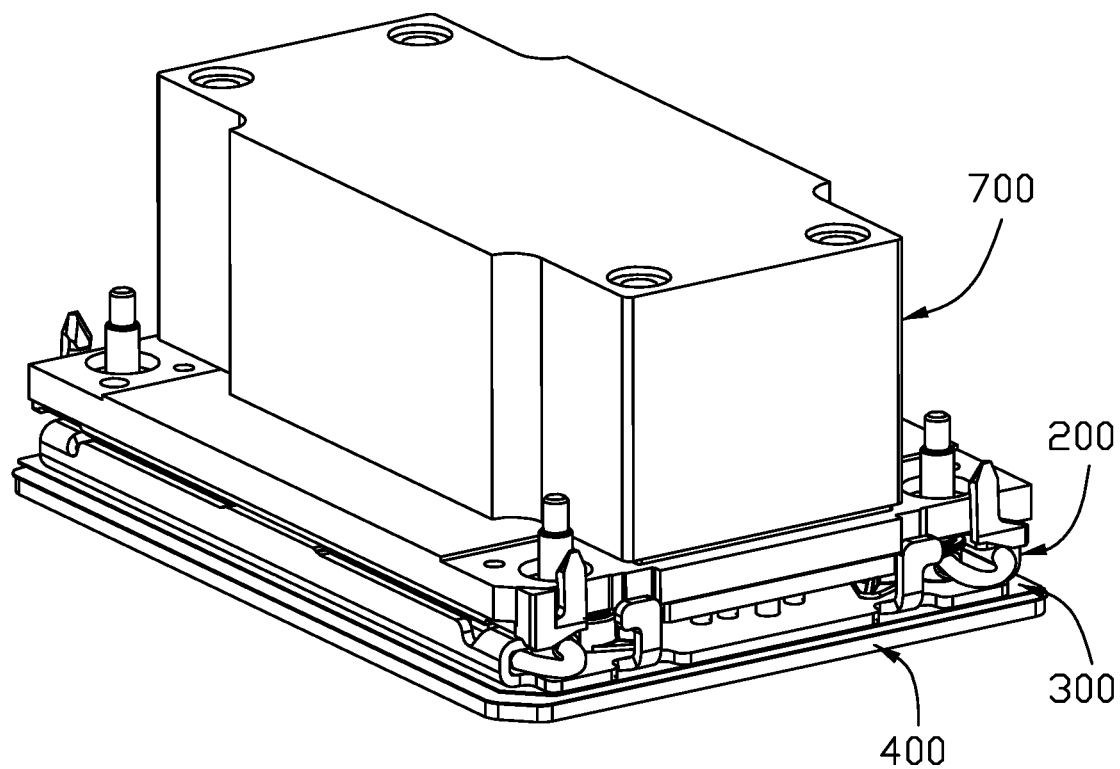
FIG. 1(A) is a perspective view of an electrical assembly of the present invention.
Figure 1B:
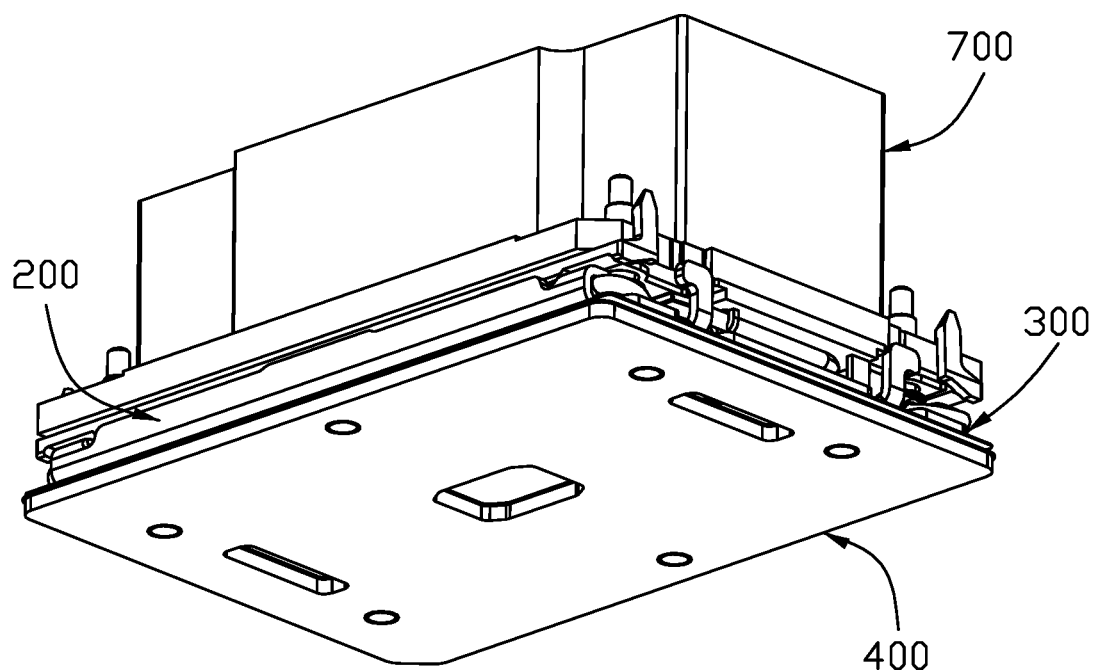
FIG. 1(B) is another perspective view of the electrical assembly of FIG. 1(A)
Figure 2A:
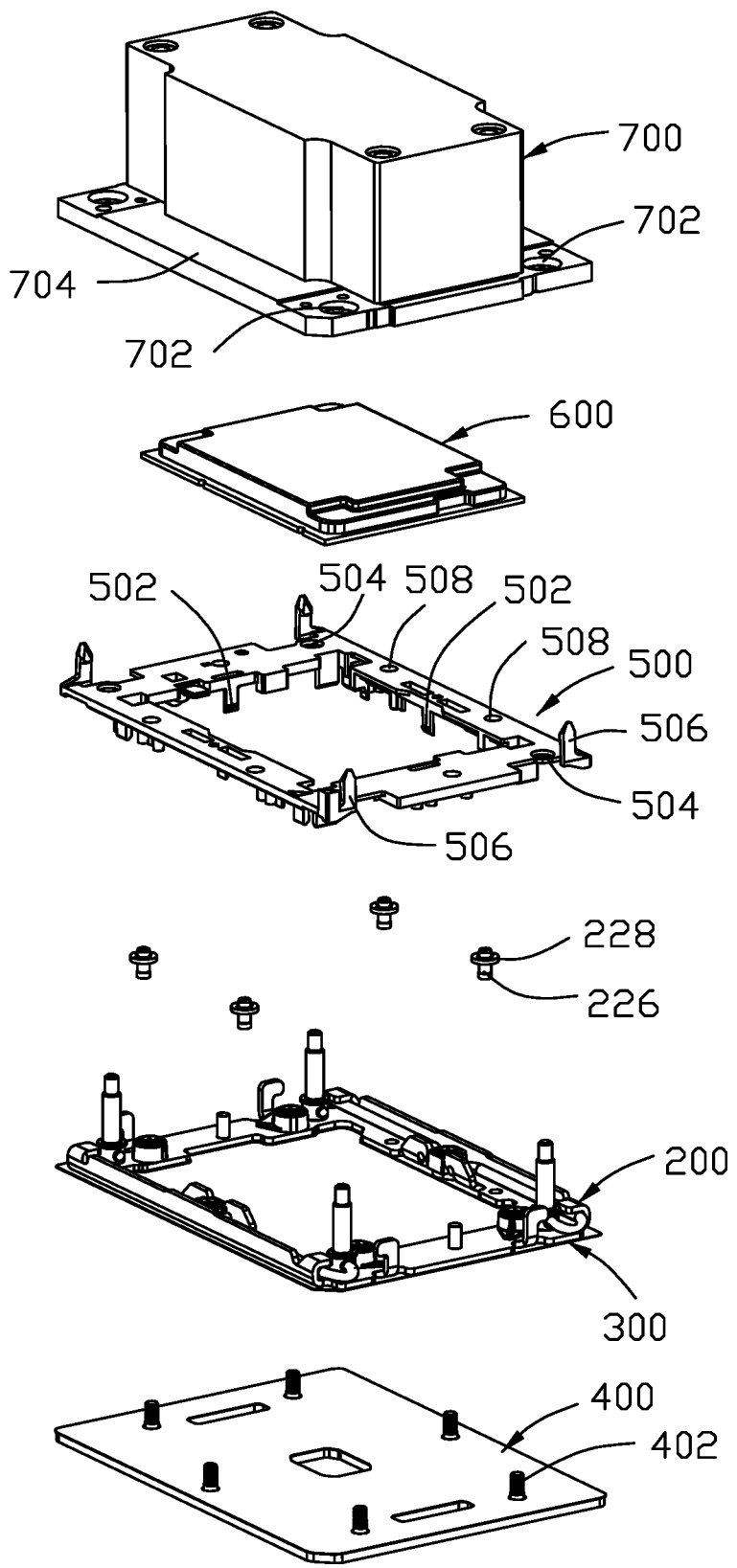
FIG. 2(A) is an exploded perspective view of the electrical assembly of FIG. 1(A)
Figure 2B:
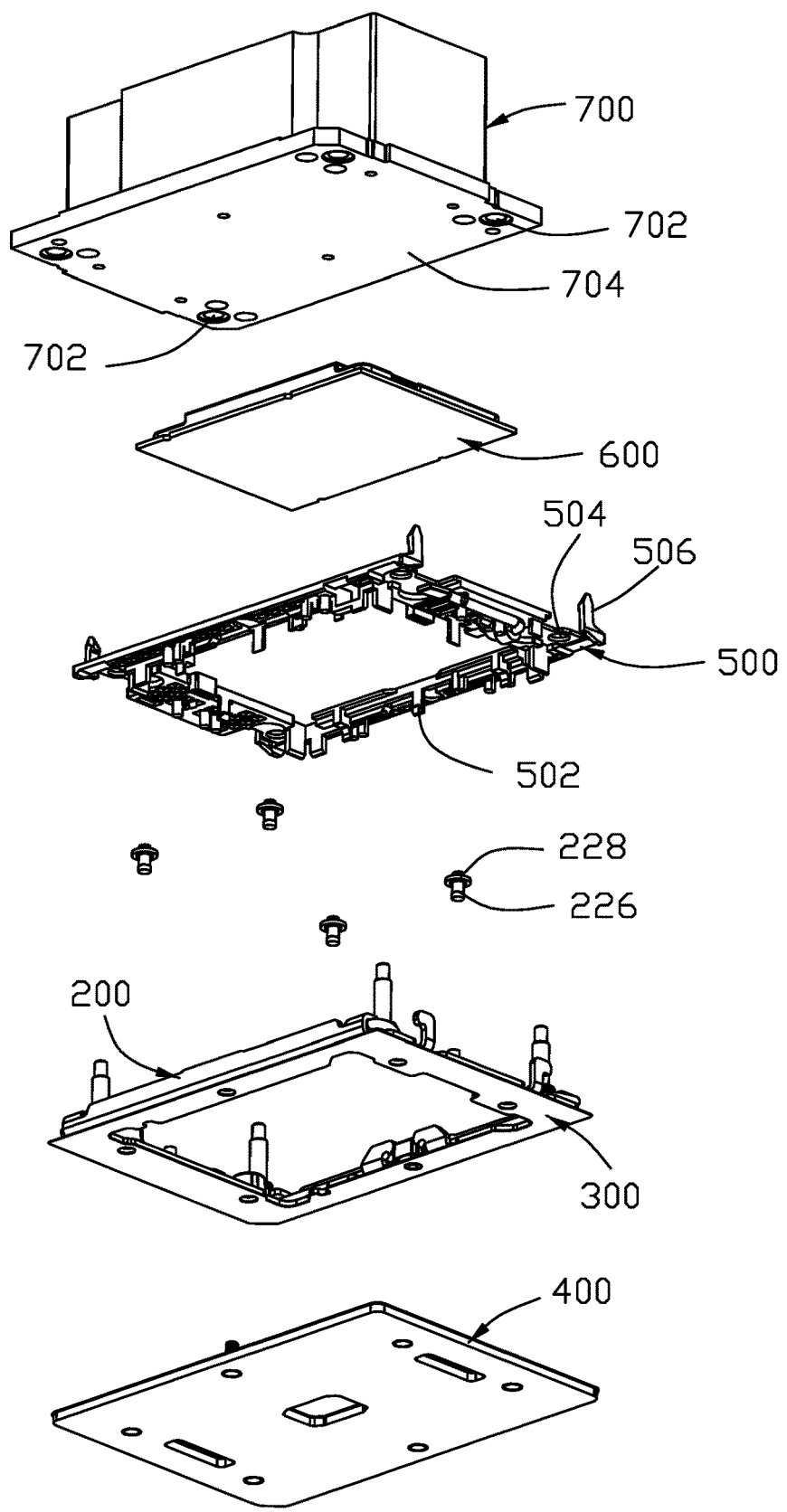
FIG. 2(B) is another exploded perspective view of the electrical assembly of FIG. 2(A)
Figure 3:
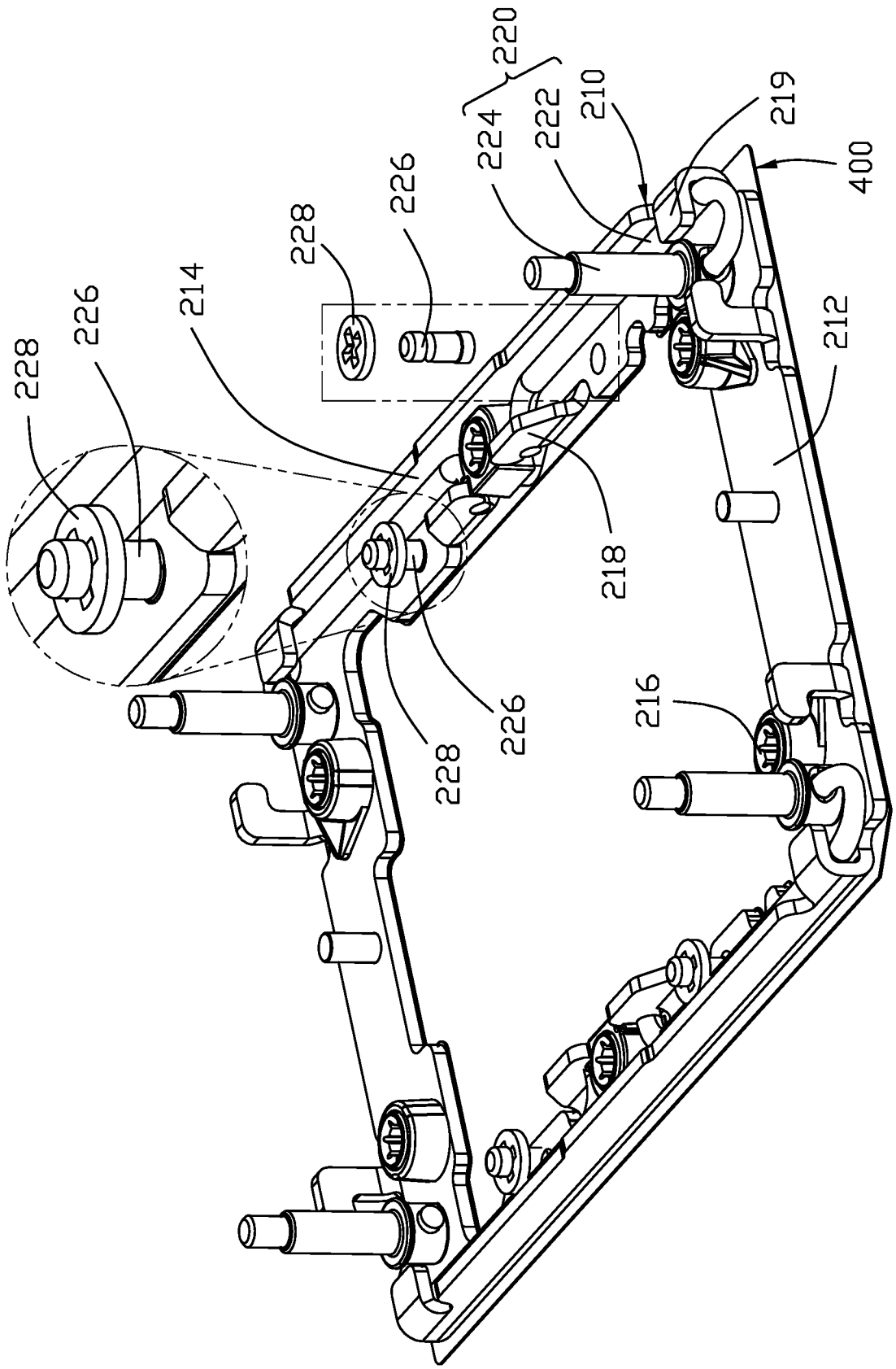
FIG. 3 is a perspective view of the load force bolster assembly of the electrical assembly of FIG. 1(A)
Figure 3A:
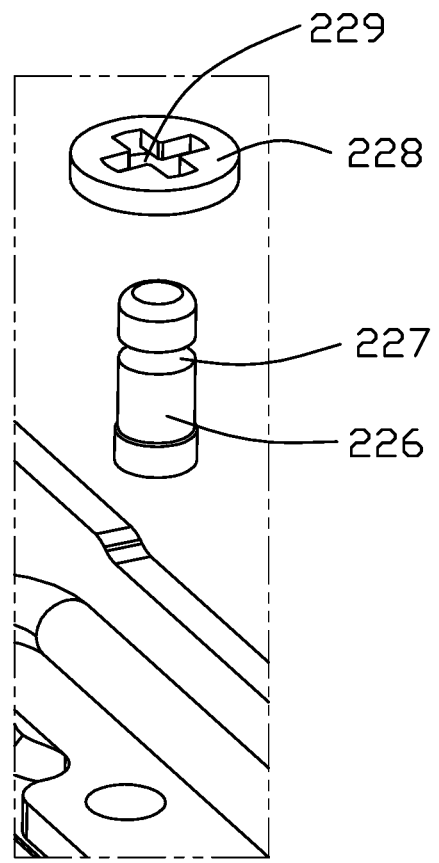
FIG. 3(A) is an enlarged view of a portion of the load force bolster assembly of FIG. 3 with the printed circuit board thereunder to show the stud and the pressing ring thereof.
Figure 4:
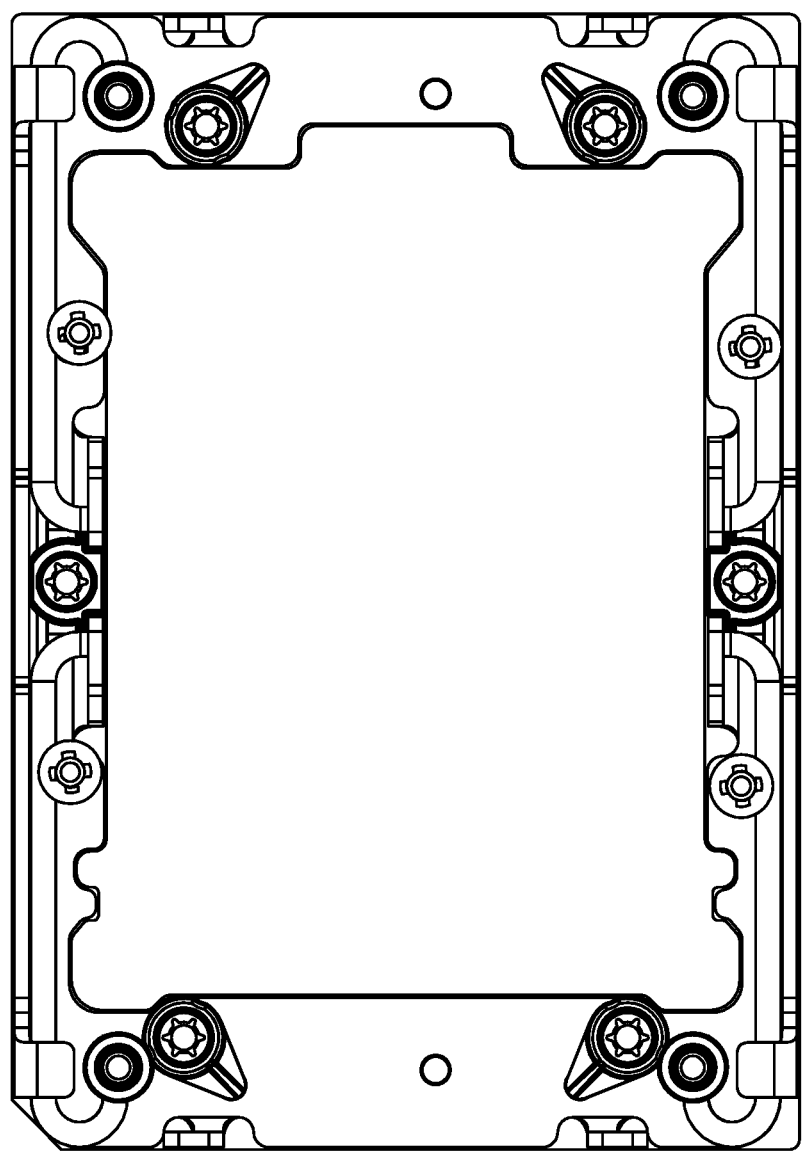
FIG. 4 is a top view of the bolster assembly of FIG. 3.
Figure 5B:
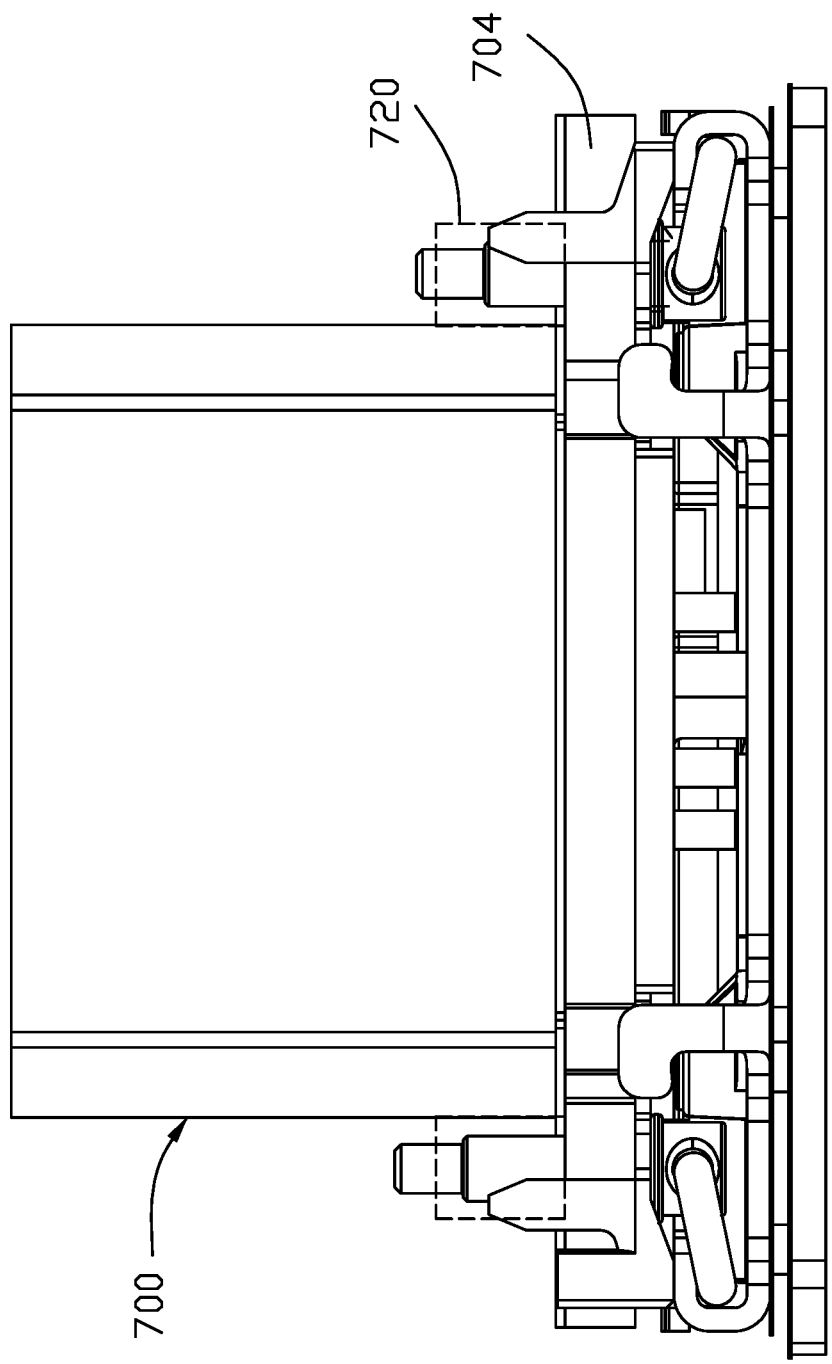
FIG. 5(B) is a side view of the electrical assembly of FIG. 1(A) when the stud is raised up.

An electrical assembly 10 includes a load force bolster assembly 200 cooperating with a back plate 300 to commonly sandwich a printed circuit board 400 therebetween in a vertical direction. An electrical connector (not shown in FIGS. 1(A)~5 while being shown s in the aforementioned U.S. Patent Application Publication No. 2019/0088572, is disposed within the frame like structure of the bolster assembly 200 and soldered upon the printed circuit board 400. A CPU (Central Process Unit) carrier 500 and a CPU 600 attached thereto, are commonly positioned upon the bolster assembly 200 wherein the CPU 600 is seated upon the electrical connector to mechanically and electrically connected to the corresponding contacts of the electrical connector. A heat sink 700 is positioned upon the CPU 600 and engaged with both the carrier 500 and the bolster assembly 200. Notably, the detailed structures of the heat sink 700 and those of the printed circuit board 400 are not completely shown wherein the heat sink 700 should further include a plurality fins and the printed circuit board should further be thickened.

The bolster assembly 200 includes a frame like metallic stiffener 210 having a bottom wall 212 and a pair of side walls 214 spaced from each other in a transverse direction perpendicular to the vertical direction while each side wall 214 extends along a longitudinal direction perpendicular to both the vertical direction and the transverse direction. The bottom wall 212 forms a central cavity for receive the corresponding electrical connector therein. A plurality of fastening nuts 216 press the bottom wall 212 and receive the corresponding screws 402 riveted upon the back plate 400 so as to have the printed circuit board 300 tightly sandwiched between the stiffener 210 and the back plate 400.

Four bolster mechanisms or torsion force loading mechanisms are respectively located at the four corners of the stiffener 210, each including a torsion wire 222 horizontally extending along a corner between the bottom wall 212 and the corresponding side wall 214, and an up-and-down moveable stud 224 pivotally mounted to a free end of the torsion wire 222. A plurality of vertical securing tabs 218 are formed on inner edges of the bottom wall 212. Each securing tab 218 secures the other end of the corresponding torsion wire 222. A plurality of horizontal securing tabs 219 are formed on outer edges of the bottom wall 212. Each securing tab 219 restrains the torsion wire 222 around the free end. A plurality of poles 226 are secured to the bottom wall 222. Each pole 226 cooperates with the corresponding side wall 214 to retain the corresponding torsion wire 222 in position therebetween in a transverse direction. A retention groove 227 is formed around a top portion of the pole 226 to receive therein a press ring type washer 228 which is downwardly pushed and forcibly retained to the pole 226 with the four claws 229 deformably retained in the retention groove 227. Notably, the press ring type washer 228 downwardly confronts the torsion wire 222 so as to prevent the horizontally extending main body of the torsion wire 222 from upwardly moving away from the bottom wall 212.

The carrier 500 is of a frame structure and includes a plurality of latches 502 to retain the CPU 600 therein, a plurality of through holes 504 through which the corresponding studs 224 extend, respectively, a plurality of through holes 508 through which the poles 226 extend, respectively, and a plurality of restraining tabs 506 beside the corresponding through holes 504 to restrict a base 704 of the heat sink 700. The heat sink 700 forms through holes 702 at four corners of the base 704 to receive the corresponding studs 220, respectively. A plurality of screw nuts 720 not only are fastened to the top end of the corresponding studs 224, respectively, but also abut against the base 704 so as to raise up the studs 224, thus enhancing torsion forces of the torsioned wire 222. Notably, the torsioned wire 222 is already in a preloaded state when the stud 224 is seated upon the stiffener 210. The lift-up of the stud 224 due to attachment of the screw nut 720 against the base 704 of the heat sink 700, may increase the torsion degree and the torsion force of the torsioned wire 222.

Understandably, to efficiently downwardly press the torsioned wire 222 in position at the corner of the stiffener 210 between the bottom 212 and the corresponding side wall 214, the press ring type washer 228 is securely retained to the pole 226 via a relatively simple manufacturing way, i.e., a downward pressing, so as to be welcomed in an automotive assembling procedure. In this embodiment, the bottom wall 212 forms recesses (not shown) to receive the bottom ends of the studs 224, respectively, so as to stabilize the upstanding studs 224 when the studs 224 is seated upon the bottom wall 212.

What is claimed is:

1. An electrical assembly comprising:
   a load force bolster assembly including:
   a metallic stiffener having a bottom wall and a pair of side walls opposite to each other in a transverse direction while each side wall extending along a longitudinal direction perpendicular to the transverse direction;
   at least one upstanding stud positioned upon the bottom wall and moveable away from the bottom wall along a vertical direction perpendicular to both the longitudinal direction and the transverse direction;
   at least one torsioned wire disposed at a corner between the bottom wall and the corresponding side wall and having a body extending along the longitudinal direction with a free end engaged with a lower section of the upstanding stud; and
   at least one restricting pole mounted upon the bottom wall and cooperating with the corresponding side wall to sandwich the torsioned wire therebetween in said transverse direction; wherein
   a top portion of the restricting pole forms a horizontal retention groove, and a pressing ring type washer is downwardly assembled upon the top portion of the restricting pole and retained within the retention groove so as to downwardly press the body of the torsioned wire.

2. The electrical assembly as claimed in claim 1, wherein the torsioned wire further includes a fixed end secured to a vertical securing tab formed on the bottom wall.

3. The electrical assembly as claimed in claim 1, wherein the bottom wall further forms a horizontal securing tab securing the body of the torsioned wire.

4. The electrical assembly as claimed in claim 1, wherein the retention groove is circumferential.

5. The electrical assembly as claimed in claim 1, wherein the pressing ring type washer is of a complete ring.

6. The electrical assembly as claimed in claim 1, wherein the lower section of the upstanding stud forms a hole into which the free end of the torsioned wire is received.

7. The electrical assembly as claimed in claim 1, wherein the bottom wall of the stiffener is of a frame configuration in which an electrical connector is received, a CPU (Central Processing Unit) carrier associated with a CPU is attached upon the stiffener to have the CPU contact the electrical connector, a heat sink is secured upon the CPU carrier, and a screw nut is secured to a top end of the upstanding stud and downwardly presses the heat sink to urge the heat sink to tightly contact the CPU when the torsioned wire is further torsioned.

8. The electrical assembly as claimed in claim 1, wherein the pressing ring type washer forms a plurality of claws piercing into the retention groove.

9. The electrical assembly as claimed in claim 8, wherein the claws are in a deformed manner.

10. The electrical assembly as claimed in claim 1, wherein there are four upstanding studs located at four corners of the stiffener, respectively, and two pairs of torsioned wires respectively located at two opposite corners inside the pair of side walls, and four restricting poles restraining two pairs of torsioned wires, and each restricting pole has the corresponding retention groove to retain a press ring type washer therein.

11. A load force bolster assembly comprising:
    a metallic stiffener having a bottom wall and a pair of side walls opposite to each other in a transverse direction while each extending along a longitudinal direction perpendicular to the transverse direction;
    at least one upstanding stud positioned upon the bottom wall and moveable away from the bottom wall in a vertical direction perpendicular to both the transverse direction and the longitudinal direction;
    at least one torsion spring wire seated upon the bottom wall with one immovable end retained to the stiffener and a moveable end retained to the upstanding stud;
    at least one restriction pole secured to the bottom wall to cooperate with the corresponding side wall to sandwich the torsion spring wire therebetween in the transverse direction;
    a top portion of the restriction pole forms a horizontal retention groove, and a pressing ring type washer is secured within the horizontal retention groove to restrict upward movement of the torsion spring wire in the vertical direction.

12. The load force bolster assembly as claimed in claim 11, wherein the pressing ring type washer includes a plurality of claws grasping the restriction pole and retained in the horizontal retention groove.

13. The load force bolster assembly as claimed in claim 11, wherein the moveable end of the torsion spring wire is retained to a lower portion of the upstanding stud.

14. The load force bolster assembly as claimed in claim 11, wherein the torsion spring wire abuts against the bottom wall in a preloaded manner.

* * * * *